T 861,033

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specifications, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED APRIL 15, 1969

861 O.G. 705

755,382
COLOUR PROOFING PROCESS
John H. Boielle, 83 Dundale Road, Tring, Hertfordshire, England
Filed Aug. 26, 1968. Published Apr. 15, 1969
Class 96—29
No Drawing. 9 Pages Specification

A colour proofing process which comprises (1) developing an exposed, light-sensitive silver halide emulsion layer with a silver halide developing agent, (2) dissolving the undeveloped silver halide with a silver halide solvent, (3) diffusing the solubilized silver halide to a nucleated gelatin pigmented receiving layer on a support to form a silver image in the nucleated layer, and (4) etch-bleaching the silver image in the nucleated layer with an etch bleach solution to form a pigmented relief image. The support may be transparent so that overlays can be used to provide proofs or the image may be transferred to another support in register with similar images to provide a coloured proof.